United States Patent
Torii (10) Patent No.: US 7,709,931 B2
(45) Date of Patent: May 4, 2010

(54) TRENCHED SEMICONDUCTOR DEVICE

(75) Inventor: Katsuyuki Torii, Saitama (JP)

(73) Assignee: Sanken Electric Co., Ltd. (JP)

( * ) Notice: Subject to any disclaimer, the term of this patent is extended or adjusted under 35 U.S.C. 154(b) by 49 days.

(21) Appl. No.: 12/138,893

(22) Filed: Jun. 13, 2008

(65) Prior Publication Data

US 2008/0251810 A1 Oct. 16, 2008

Related U.S. Application Data (63) Continuation of application No. PCT/JP2006/324688, filed on Dec. 11, 2006.

(30) Foreign Application Priority Data

Dec. 14, 2005 (JP) .............................. 2005-360622

(51) Int. Cl.
*H01L 21/331* (2006.01)

(52) U.S. Cl. ................ 257/586; 257/587; 257/592; 257/E29.199; 257/E29.2

(58) Field of Classification Search ............... 438/337, 438/350; 257/592, 586, 587, E29.199, E29.2
See application file for complete search history.

(56) References Cited

U.S. PATENT DOCUMENTS

| | | | | |
|---|---|---|---|---|
| 5,329,142 A * | 7/1994 | Kitagawa et al. | ............ | 257/139 |
| 5,751,024 A * | 5/1998 | Takahashi | ............... | 257/139 |
| 6,001,678 A * | 12/1999 | Takahashi | ............... | 438/238 |
| 6,040,599 A * | 3/2000 | Takahashi | ............... | 257/330 |
| 6,265,735 B1 * | 7/2001 | Takahashi et al. | ............ | 257/136 |
| 6,265,744 B1 * | 7/2001 | Okumura | ............... | 257/330 |
| 6,410,959 B2 * | 6/2002 | Numazawa et al. | ......... | 257/330 |
| 6,501,129 B2 * | 12/2002 | Osawa | ............... | 257/330 |
| 6,620,669 B2 * | 9/2003 | Hijzen et al. | ................ | 438/206 |
| 6,627,499 B2 * | 9/2003 | Osawa | ............... | 438/259 |
| 6,768,168 B1 * | 7/2004 | Takahashi | ............... | 257/330 |
| 6,828,626 B2 * | 12/2004 | Oikawa et al. | ............... | 257/330 |
| 6,855,970 B2 * | 2/2005 | Hatakeyama et al. | ....... | 257/264 |
| 6,936,893 B2 * | 8/2005 | Tanaka et al. | ............... | 257/341 |
| 7,049,186 B2 * | 5/2006 | Yanagisawa | ............... | 438/183 |
| 7,102,182 B2 * | 9/2006 | Takemori et al. | ............ | 257/271 |
| 7,211,837 B2 * | 5/2007 | Tomomatsu | ............... | 257/156 |
| 7,521,755 B2 * | 4/2009 | Takahashi | ............... | 257/330 |
| 2001/0003367 A1 * | 6/2001 | Hshieh et al. | ............... | 257/330 |
| 2003/0080355 A1 | 5/2003 | Shirai | | |
| 2007/0096172 A1 * | 5/2007 | Tihanyi et al. | ............... | 257/288 |
| 2008/0067542 A1 * | 3/2008 | Tanaka et al. | ............... | 257/139 |

FOREIGN PATENT DOCUMENTS

| EP | 0795911 A2 | 9/1997 |
|---|---|---|
| EP | 0801425 A1 | 10/1997 |
| JP | 2005057028 | 3/2005 |

\* cited by examiner

*Primary Examiner*—George Fourson
(74) *Attorney, Agent, or Firm*—Woodcock Washburn LLP (57) ABSTRACT

An IGBT is disclosed which has a set of inside trenches and an outside trench formed in its semiconductor substrate. The substrate has emitter regions adjacent the trenches, a p-type base region adjacent the emitter regions and trenches, and an n-type base region comprising a first and a second subregion contiguous to each other. The first subregion of the n-type base region is contiguous to the inside trenches whereas the second subregion, less in impurity concentration than the first, is disposed adjacent the outside trench. Breakdown is easier to occur than heretofore adjacent the inside trenches, saving the device from destruction through mitigation of a concentrated current flow adjacent the outside trench.

6 Claims, 6 Drawing Sheets

TRENCHED SEMICONDUCTOR DEVICE

CROSS REFERENCE TO RELATED APPLICATIONS

This is a continuation of Application PCT/JP2006/324688, filed Dec. 11, 2006, which claims priority to Japanese Patent Application No. 2005-360622 filed Dec. 14, 2005.

BACKGROUND OF THE INVENTION

This invention relates to semiconductor devices, particularly to those having trenches formed in their substrate, and more particularly to trenched semiconductor devices of improved immunity to destruction. The trenched semiconductor devices according to the invention include, but are not limited to, an insulated-gate bipolar transistor (IGBT) and insulated-gate field-effect transistor (IGFET).

Figure 1:
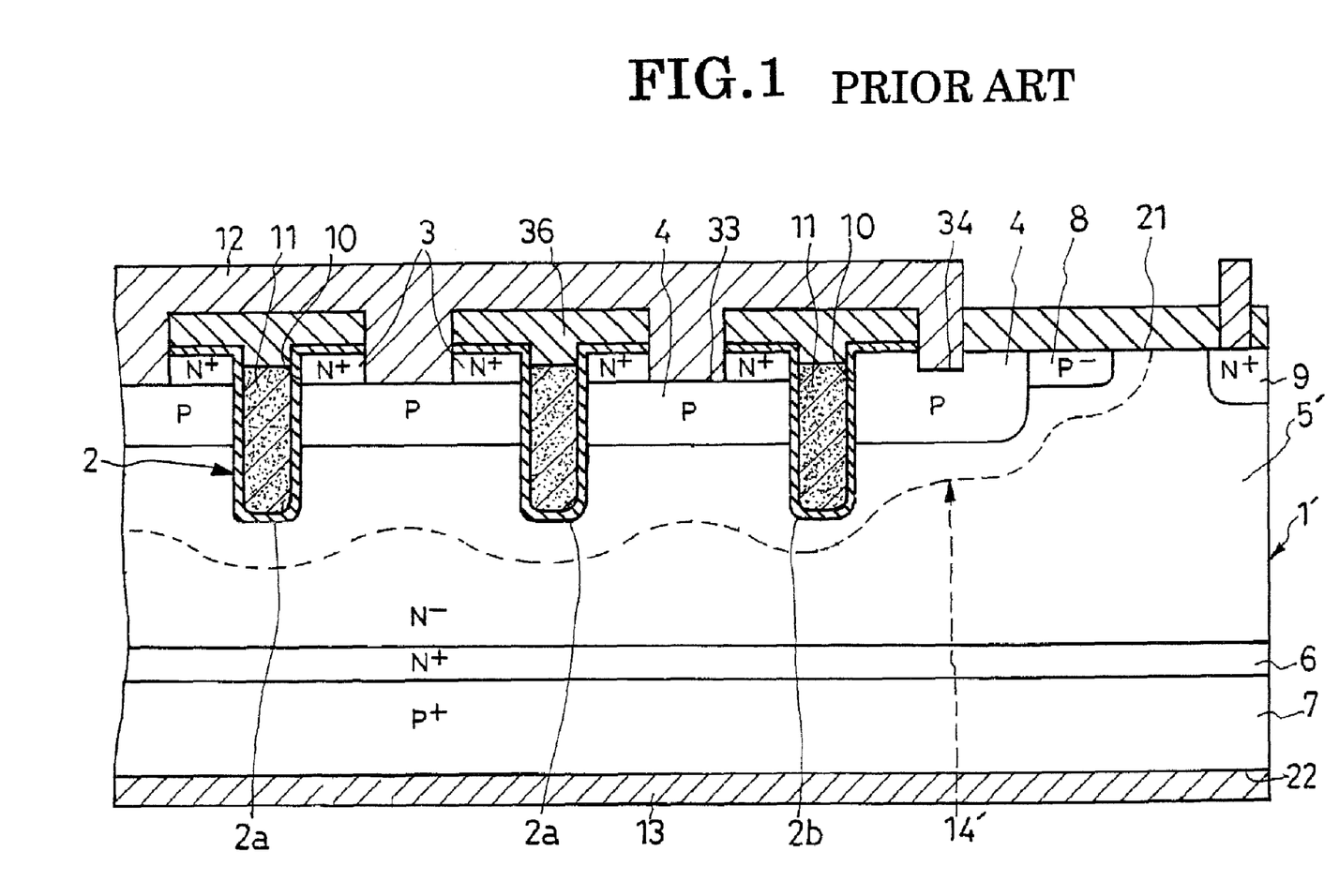
FIG. 1 is a fragmentary, schematic section through the prior art IGBT assessed above.

Japanese Unexamined Patent Publication No. 2005-57028 is hereby cited as teaching an IGBT that is trenched for a higher breakdown voltage. As illustrated in FIG. 1 for a better understanding of the features of the instant invention, the prior art trenched IGBT has a plurality of trenches 2 in its semiconductor substrate 1'. The substrate 1' is variously doped to include n-type emitter regions 3, p-type base region 4, n-type base region 5, $n^+$-type buffer region 6, $p^+$-type collector region 7, $p^-$-type reduced surface field (RESURF) region 8, and $n^+$-type channel stop region 9. The trenches 2 receive gate conductors 11 as gate electrodes via gate insulators 10. An emitter electrode 12 is received in part in recesses 33 and 34 in one major surface 21 of the substrate 1', in part overlies the trenches 2 via insulators 36, and is electrically coupled directly to both n-type emitter regions 3 and p-type base region 4. A collector electrode 13 underlies the other major surface 22 of the substrate 1' and adjoins the $p^+$-type collector region 7.

In order to turn this prior art IGBT on, a gate voltage may be applied to make the gate conductors 11 higher in potential than the emitter electrode 12, with the collector electrode 13 held higher in potential than the emitter electrode. The result is the creation of a channel in the $p^+$-type base region 4 adjacent the trenches 2, permitting a current flow from collector electrode 13 to emitter electrode 12. The prior art IGBT is turned off by making the gate conductors 11 less in potential than the threshold. Thereupon the channel will disappear from the p-type base region 4. During the ensuing off period, the voltage between collector electrode 13 and emitter electrode 12 will be higher than that during the on period. A relatively high reverse bias voltage will be impressed between p-type base regions 4 and n-type base region 5, and a depletion layer or depletion region 14' will spread as indicated by the broken line in FIG. 1.

The contour of the depletion region 14' depends upon the relative positions of the trenches 2, which may be thought of as comprising a series of relatively inside trenches $2_a$ and an outside trench $2_b$. The depletion region 14' will be contoured mostly as desired in the neighborhoods of the inside trenches $2_a$, successfully mitigating field concentrations. Adjacent the outside trench $2_b$, however, the depletion region will not spread so much as desired because it has a neighboring trench on one side only, rather than on both sides like each of the inside trenches $2_a$. The field intensity will therefore become higher there than in the vicinities of the inside trenches. Breakdown has therefore been easy to occur near this outmost trench, with the consequent flow of a concentrated large current eventually leading to the destruction of the IGBT in the worst case.

An obvious expedient for alleviation of field intensity adjacent the outmost trench might seem to make the p-type base region 4 deeper on the outside of that trench. Such deeper part of the base region 4 would serve to spread the depletion region deeper for mitigation of field concentration adjacent the outmost trench. This measure is objectionable because the diffusion of a p-type dopant is the only possible way of deepening the required part of the base region 4. The deeper diffusion of the p-type dopant would inevitably invite its lateral (horizontal) diffusion in addition to that in the depth (vertical) direction. The base region 4 would therefore become larger in its surface area, necessitating use of a correspondingly larger substrate.

The above discussed problems arising from trenches are not limited to IGBTs. Similar difficulties have been encountered with other types of trenched semiconductor devices notably including IGFETs.

SUMMARY OF THE INVENTION

The present invention has it as an object to enhance the immunity to destruction of trenched semiconductor devices of the kinds defined.

For the attainment of the above and other objects, the present invention provides a trenched semiconductor device characterized by comprising: a substrate of semiconducting material having a plurality of inside trenches and an outside trench formed therein, both inside and outside trenches each extending from a first toward a second major surface of the substrate; a first semiconductor region (e.g., emitter region) of a first conductivity type formed in the substrate contiguous to the inside trenches and exposed at the first major surface of the substrate; a second semiconductor region (e.g., p-type base region) of a second conductivity type formed in the substrate and contiguously underlying the first semiconductor region, the second semiconductor region being contiguous to both inside trenches and outside trench and being exposed in part at the first major surface of the substrate; a third semiconductor region (e.g., first n-type base subregion) of the first conductivity type formed in the substrate contiguous to both of the second semiconductor region and the inside trenches, the third semiconductor region being buried deeper in the substrate from the first major surface thereof than the inside trenches; a fourth semiconductor region (second n-type base subregion) of the first conductivity type formed in the substrate contiguous to all of the second and the third semiconductor region and the outside trench and partly exposed at the first major surface of the substrate on the outside of the outside trench, the fourth semiconductor region being less in impurity concentration than the third semiconductor region; an insulating film in each of the inside trenches and the outside trench; a plurality of trench conductors received one in each of the inside trenches and the outside trench via the insulating film; a first primary electrode (e.g., emitter electrode) electrically coupled to the first semiconductor region; a second primary electrode (e.g., collector electrode) electrically coupled to the fourth semiconductor region; and a gate electrode electrically coupled to the trench conductors.

The trenched semiconductor device according to the invention may further comprise a fifth semiconductor region of the second conductivity type disposed between the fourth semiconductor region and the second major surface of the substrate and electrically coupled to the second primary electrode.

The trenched semiconductor device according to the invention may further comprise a sixth semiconductor region of the first conductivity type disposed between the fourth and the fifth semiconductor region, the sixth semiconductor region being higher in impurity concentration than the fourth semiconductor region.

The second primary electrode may take the form of a metal-made electrode in Schottky contact with the fourth semiconductor region.

The sum of the edges bounding the entrance ends of the inside trenches may be made longer than the sum of the outmost edges of the entrance end of said outside trench.

The sum of the areas of the entrance ends of the inside trenches may be made greater than that of the outside trench.

The third semiconductor region of the first conductivity type in the foregoing summary of the invention is higher in impurity concentration than the fourth semiconductor region of the first conductivity type. Consequently, when the device is turned on, the depletion region due to the pn junction between the second semiconductor region of the second conductivity type and the third semiconductor region of the first conductivity type spreads less than does the depletion region due to the pn junction between the second and the fourth semiconductor region of the above prior art device from which the third semiconductor region is absent. Breakdown is therefore easier to occur adjacent the inside trenches than in the prior art device, resulting in a more uniform distribution of the current flowing through the substrate. Since the breakdown current is far less prone to concentrate adjacent the outside trench, the device according to the invention has improved immunity to destruction.

DESCRIPTION OF THE PREFERRED EMBODIMENTS

Figure 2:
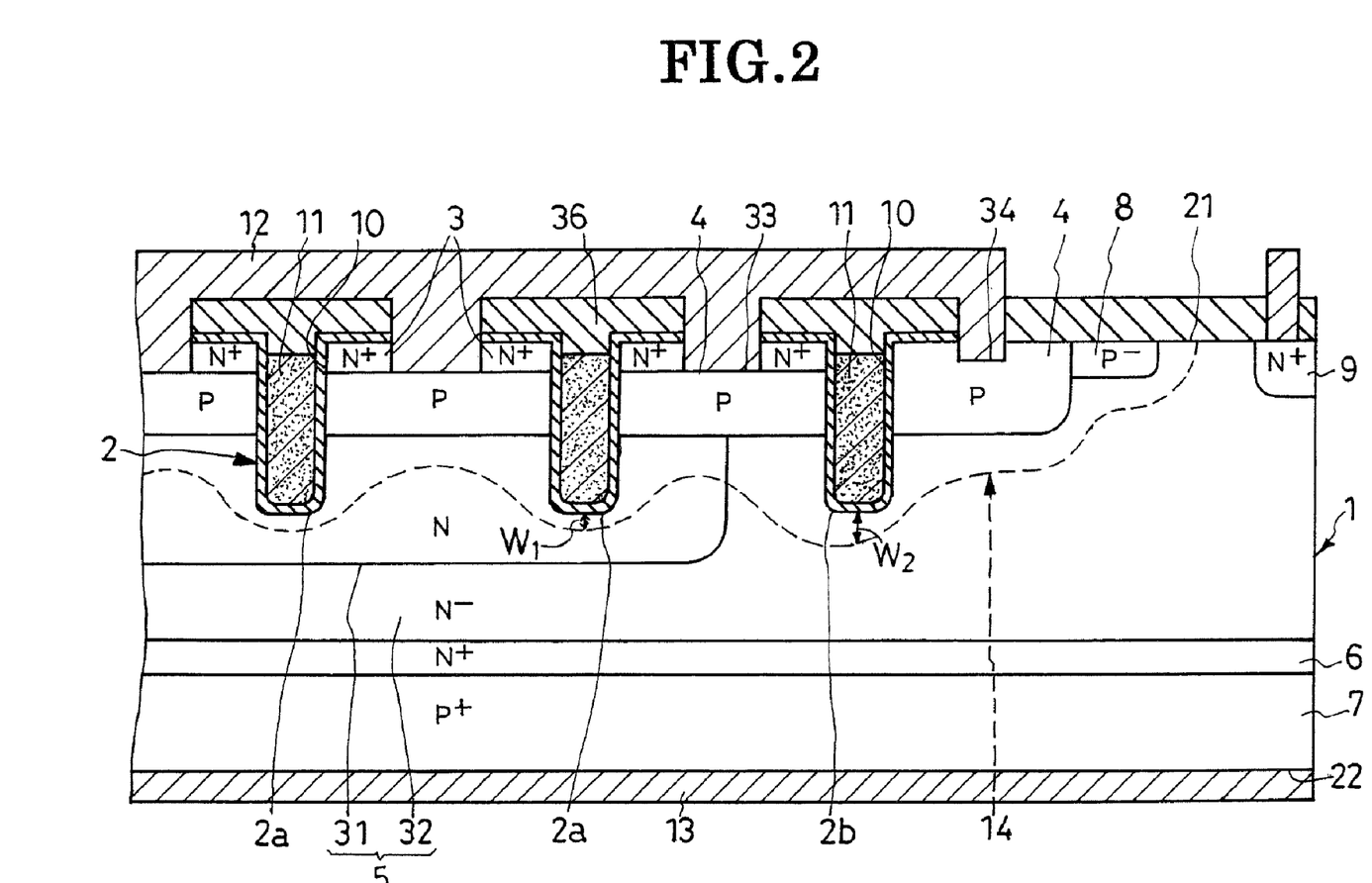
FIG. 2 is a fragmentary, schematic section (taken along the line A-A in FIG. 3) through the IGBT constructed in accordance with the novel concepts of this invention.
Figure 3:
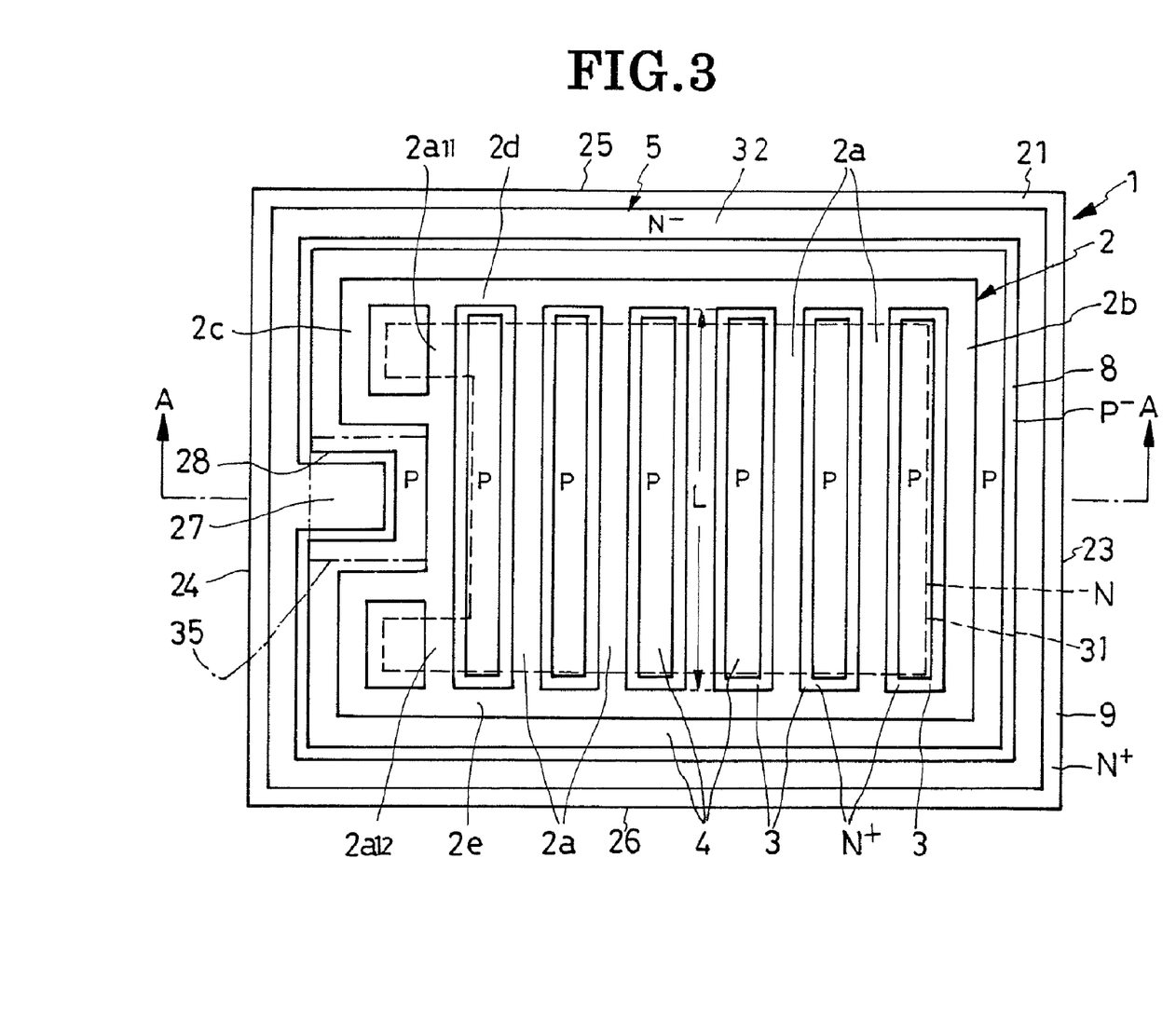
FIG. 3 is a plan view of the substrate of the IGBT of FIG. 2.

The invention will now be described more specifically as embodied by way of example in the trenched IGBT shown in FIGS. 2 and 3 of the above drawings. FIG. 2, taken along the line A-A in FIG. 3, shows part of the trenched IGBT. FIG. 3 diagrammatically illustrates the semiconductor substrate 1 of the IGBT as seen from above. Like reference characters indicate like parts in FIGS. 1-3.

Made from silicon for example, the substrate 1 has a pair of opposite major surfaces 21 and 22. Trenches 2 each extend from the first major surface 21 toward the other 22. As indicated in FIG. 3, the first major surface 21 has a first pair of opposite sides 23 and 24 and a second pair of opposite sides 25 and 26, all combined into rectangular shape.

FIG. 3 best illustrates the geometry of the trenches 2. These trenches include:

1. A plurality of, five in this embodiment, inside trenches $2_a$ all extending in parallel spaced relationship to one another;

2. Two additional inside trenches $2_{a11}$ and $2_{a12}$ extending in alignment with each other parallel to the inside trenches $2_a$;

3. A first pair of outside trenches $2_b$ and $2_c$ extending parallel to the inside trenches $2_a$ and lying outside the predefined inside portion, outlined by broken lines in FIG. 3, of the substrate 1 which encompasses the inside trenches $2_a$ and additional inside trenches $2_{a11}$ and $2_{a12}$ and which is substantially equivalent to the location of a first subregion 31, FIG. 2, of an n-type base region 5 to be detailed subsequently; and 4. A second pair of outside trenches $2_d$ and $2_e$ also lying outside the noted inside portion of the substrate surface 21 and extending at right angles with the first pair of outside trenches $2_b$ and $2_c$.

The inside trenches $2_a$ as well as the two additional inside trenches $2_{a11}$ and $2_{a12}$ are all joined together via the second pair of outside trenches $2_d$ and $2_e$, which in turn are joined to the first pair of outside trenches $2_b$ and $2_c$. Alternatively, the inside trenches $2_a$, $2_{a11}$ and $2_{a12}$ may be separated from the outside trenches $2_b$-$2_e$.

More specifically, the inside trenches $2_a$ extend a prescribed distance L at certain, preferably constant, spacings from one another and parallel to the first pair of opposite sides 23 and 24 of the substrate surface 21 between the second pair of opposite sides 25 and 26. The first, $2_b$, of the first pair of outside trenches $2_b$ and $2_c$ lies next to the side 23 of the substrate surface 21 and extends parallel to the inside trenches $2_a$. The second outside trench $2_c$ lies next to the side 24 of the substrate surface 21 and is formed to include a U-shaped detour 28 to extend clear of a gate pad electrode area 27 on the substrate 1. The two additional inside trenches $2_{a11}$ and $2_{a12}$ extend respectively between this U-shaped detour 28 of the second outside trench $2_c$ and the second pair of outside trenches $2_d$ and $2_e$. The second outside trench $2_c$ could be formed rectilinearly like the first outside trench $2_b$. The second pair of outside trenches $2_d$ and $2_e$ are disposed next to the second pair of opposite sides 25 and 26, respectively, and joined endwise to the first pair of outside trenches $2_b$ and $2_e$.

Equal spacings exist between the inside trenches $2_a$, between the two additional inside trenches $2_{a11}$ and $2_{a12}$ and the neighboring inside trench $2_a$, and between the four outside trenches $2_b$-$2_e$ and the inside trenches $2_a$ and additional inside trenches $2_{a11}$ and $2_{a12}$. All these trenches $2_a$, $2_{a11}$, $2_{a12}$ and $2_b$-$2_e$ are also equal in depth.

FIG. 3 also reveals that the sum of the lengths of the entrance end edges of all the inside trenches $2_a$ and additional inside trenches $2_{a11}$ and $2_{a12}$ is longer than the sum of the lengths of the outer edges (extending along the four sides 23-26 of the substrate surface 21) of all the outside trenches $2_b$-$2_e$. The sum of the cross sectional areas (areas as seen from above as in FIG. 3) of all the inside trenches $2_a$ and additional inside trenches $2_{a11}$ and $2_{a12}$ is greater than the sum of the cross sectional areas (as defined above) of all the outside trenches $2_b$-$2_e$.

As better illustrated in FIG. 2, and in part in FIG. 3, the semiconductor substrate 1 has formed therein the n$^+$-type emitter regions 3 as the first semiconductor region of the first conductivity type, p-type base regions 4 as the second semiconductor region of the second conductivity type, n-type base (drift) region 5, p$^+$-type collector region 7 as the fifth semiconductor region of the second conductivity type, n$^+$-type buffer region 6 as the sixth semiconductor region of the first conductivity type, p$^-$-type RESURF region 8, and n$^+$-type channel stop region 9. The term "n-type base region 5" collectively refers to the first n-type base subregion 31 as the third semiconductor region of the first conductivity type of relatively high impurity concentration and second n⁻-type base subregion 32 as the fourth semiconductor region of the first conductivity type of relatively low impurity concentration. A more detailed explanation of these substrate regions and subregions follows.

The n⁺-type emitter region 3 is exposed at the substrate surface 21 and disposed next to the entrance ends of all of the inside trenches $2_a$, additional inside trenches $2_{a11}$ and $2_{a12}$, and outside trenches $2_b$-$2_e$. The emitter region 3 is formed by diffusion of a known n-type dopant.

The p-type base regions 4 adjoin all of the n⁺-type emitter regions 3, inside trenches $2_a$, additional inside trenches $2_{a11}$ and $2_{a12}$, and outside trenches $2_b$-$2_e$. The p-type base regions 4 as a whole are formed island-like in the substrate 1 and only peripherally exposed at its surface 21, with the exposed periphery of the p-type base regions 4 being disposed outside the outside trenches $2_b$-$2_e$ as in FIG. 3. As seen in FIG. 2, depressions 33 are formed in the substrate surface 21 parallel to, and in alternation with, the inside trenches $2_a$. Similar depressions 34 are also formed in the substrate surface 21 outwardly of the outside trenches $2_b$-$2_e$. The p-type base regions 4 are partly exposed through these depressions 33 and 34. The maximum depth of the p-type base regions 4, as measured from the substrate surface 21, is less than that of the trenches 2. Thus the base regions 4 are divided into the discrete segments as the trenches 2 extend downwardly past the same.

When the IGBT is turned on, an n-type channel is created in the p-type base regions 4 adjacent the trenches 2. The base regions 4 are doped with a p-type impurity to a concentration of, say, $1 \times 10^{17}$ cm⁻³, which is higher than the n-type impurity concentrations of the subregions 31 and 32 of the n-type base region 5.

The first subregion (subdrift region) 31 of the n-type base region 5 is designed to restrict the spreading of the depletion region or depletion layer 14 according to the novel concepts of this invention. Positioned away from the substrate surface 21, the first base subregion 31 directly underlies the p-type base regions 4 and adjoins the inside trenches $2_a$ and additional inside trenches $2_{a11}$ and $2_{a12}$. Further, as depicted by the broken lines in FIG. 3, the first base subregion 31 is formed only in the aforesaid inside portion of the substrate 1 which contains the inside trenches $2_a$ and additional inside trenches $2_{a11}$ and $2_{a12}$. The first base subregion 31 has its bottom situated deeper from the substrate surface 21 than are the bottoms of trenches 2, to such an extent that the inside trenches $2_a$ and additional inside trenches $2_{a11}$ and $2_{a12}$ have their bottoms contained in the first base subregion 31. The first base subregion 31 has an n-type impurity concentration of, say, $1 \times 10^{16}$ cm⁻³, which is higher than the n-type impurity concentration of the second base subregion 32, yet to be detailed, and lower than the p-type impurity concentration of the base regions 4.

It is recognized that Japanese Unexamined Patent Publication No. 2005-57028, supra, discloses an IGBT having both n- and n⁻-type base subregions. However, the n-type base subregion of this prior art device encloses the outside trenches, unlike the first base subregion 31 of the instant invention which does not, and so fails to win the desired results of this invention.

The first base subregion 31 is formed by diffusing an n-type impurity into the substrate 1 from its surface 21. The concentration of the thus diffused n-type impurity should be such that the thickness $W_1$, FIG. 2, of the depletion region created under the inside trenches $2_a$ is not more than the thickness $W_2$ of the depletion region under the outside trench $2_b$.

The n⁻-type second subregion 32 of the n-type base region 5 is formed by epitaxially growing n⁻-type silicon on the n⁺-type buffer region 6. This second base subregion 32 is contiguous to all of the first base subregion 31, the p-type base regions 4 in the neighborhoods of the outside trenches $2_b$-$2_e$, those parts of the outside trenches $2_b$-$2_e$ which project downwardly of the base regions 4, the p⁻-type RESURF region 8, and the n⁺-type channel stop region 9, and is exposed at the substrate surface 21 between the RESURF region 8 and channel stop region 9. Like the n-type base region 5' of the prior art device in FIG. 1, the second base subregion 32 functions to brings about known conductivity modulation. The second base subregion 32 has an n-type impurity concentration of, say, $1 \times 10^{15}$ cm⁻³, which is less than that of the first base subregion 31. The second base subregion 32 mostly lies underneath the first base subregion 31.

The p⁺-type collector region 7 constitutes the lowermost layer of the substrate 1, is exposed at its surface 22, and is electrically coupled to the underlying collector electrode 13. The collector region 7 supplies holes when the device is forward biased, causing conductivity modulation in the base subregions 31 and 32. The collector region 7 additionally serves as base (substrate) for epitaxially growing thereon the buffer region 6, yet to be detailed, and the other regions overlying the buffer region.

The n⁺-type buffer region 6 is epitaxially grown on the p⁺-type collector region 7 and is higher in impurity concentration than the overlying base subregions 31 and 32. The buffer region 6 serves to suppress a phenomenon known as latchup by limiting the amount of holes injected from collector region 7 into second base subregion 32. The buffer region 6 may be formed by diffusion of an n-type impurity into part of the p⁺-type collector region (substrate) 7 rather than by epitaxial growth. The buffer region 6 might be considered another subregion of the base region 5 or even be eliminated altogether, in which latter case the second base subregion 32 would come into direct contact with the p⁺-type collector region 7.

The p⁻-type RESURF region 8 extends along the periphery of the p-type base regions 4 for optimal charge balance at the substrate surface 21. The impurity concentration of the RESURF region 8 is less than that of the base regions 4.

The N⁺-type channel stop region 9 lies further outwardly of the RESURF region 8 and extends all along the perimeter of the substrate surface 21.

FIG. 2 indicates that the trenches 2 have their walls covered with gate insulators 10 which are flanged to overlie the emitter regions 3 extending along the entrance ends of the trenches. Gate conductors 11 of electroconductive polysilicon or like material are received in the trenches 2 via the gate insulators 10. Thus held opposite the p-type base regions 4 via the gate insulators 10, the gate conductors 11 function as gate electrodes for creating the channel in the base regions 4. It is understood that the gate conductors 11 within all of the inside trenches $2_a$, additional inside trenches $2_{a11}$ and $2_{a12}$, and outside trenches $2_b$-$2_e$ are all electrically connected to a gate pad electrode or gate electrode depicted by the broken lines in FIG. 3 and therein designated 35.

FIG. 2 also shows an emitter electrode 12 which is received in part in the depressions 33 and 34 in the substrate surface 21. The emitter electrode 12 is in contact both with the n⁺-type emitter regions 3 bounding the sides of the depressions 33 and with the p-type base regions 4 bounding the bottoms of the depressions 33 and 34. For electrically interconnecting all the emitter regions 3 which are divided into discrete segments by the trenches 2, the emitter electrode 12 extends all over the gate conductors 11 and the flanges of the gate insulators 10 via insulators 36.

The improved IGBT of this invention, constructed as above described with reference to FIGS. 2 and 3, is akin in construction to the prior art device of FIG. 1 except for the first subregion 31 of the n-type base region 5. The operation of the inventive device is therefore also similar, by and large, to that of the prior art. Namely, the device will turn on when a gate control voltage in excess of a predetermined threshold is applied between the gate conductors 11 and emitter electrode 12, with the collector electrode 13 held higher in potential than the emitter electrode 12. An n-type channel will then appear in the p-type base regions 4, permitting current flow along the path comprising the collector electrode 13, p$^+$-type collector region 7, buffer region 6, n-type base region 5, channel in the p-type base regions 4, emitter regions 3, and emitter electrode 12.

The IGBT will turn off when the gate control voltage between the gate conductors 11 and emitter electrode 12 grows less than the threshold. It is understood that a unidirectional supply voltage is applied between the emitter electrode 12 and collector electrode 13 via a resistor, not shown, or the like. Therefore, when the device is off, the collector electrode 13 is higher in potential than the emitter electrode 12, with the consequent application of a reverse bias voltage to the pn junction between the p-type base regions 4 and n-type base region 5. Thus the depletion region 14 spreads from the pn junction mostly into both subregions 31 and 32 of the n-type base region 5.

As will be noted from FIG. 2, the inside trenches $2_a$ all have their lower portions contained in the first n-type base subregion 31 which is higher in impurity concentration than the second n-type base subregion 32. The depletion region 14 spreads less in the first base subregion 31 than in the second base subregion 32 adjoining the outside trench $2_b$. As a result, the thickness $W_1$ of the depletion region 14 under each inside trench $2_a$ does not exceed the thickness $W_2$ of the depletion region under the outside trench $2_b$. Consequently, upon application of a sufficiently high voltage between the emitter electrode 12 and collector electrode 13 while the IGBT is off, breakdown will occur adjacent the inside trenches $2_a$ either earlier than, or concurrently with, that adjacent the outside trench $2_b$.

Let L be the length of each of the pair of opposite longitudinal edges of each of the five inside trenches $2_a$ shown in FIG. 3. Then the sum A of the lengths L of the all the pairs of longitudinal edges of the five inside trenches $2_a$ is: A=5×2×L=10×L. The sum B of the length of the outmost edge of the outside trench $2_b$ and the total length of those portions of the other outside trench $2_c$ which extend parallel to the inside trenches $2_a$ is: B=2×L. The sum A is greater than the sum B. Also, as seen in a plan view as in FIG. 3, the sum of the areas of the inside trenches $2_a$ and additional inside trenches $2_{a11}$ and $2_{a12}$ is greater than the sum of the areas of the outside trenches $2_b$ and $2_c$.

Thus, in the IGBT proposed by this invention, the sum of the areas adjacent the inside trenches $2_a$ where breakdown is easy to occur is greater than the sum of the areas adjacent the outside trenches $2_b$ where breakdown is easy to occur in the prior art device of FIG. 1. An increase in the area where breakdown is easy to occur is desirable for a more uniform flow of current due to the breakdown and hence for greater immunity of the IGBT to destruction, instead of concentrated current flow which may lead to the destruction of the IGBT.

Figure 4:
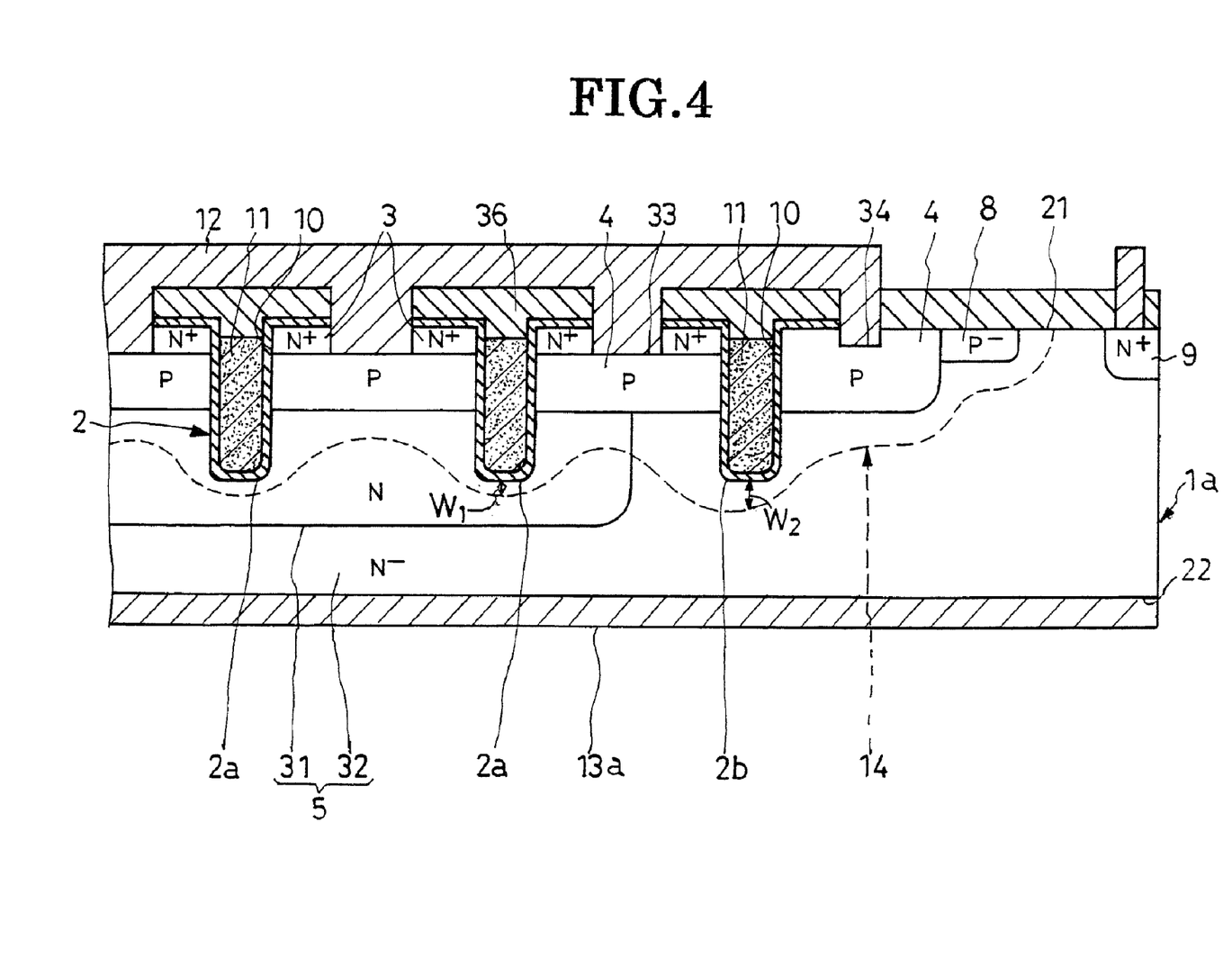
FIG. 4 is a view similar to FIG. 2 but showing another preferred form of IGBT according to the invention.

Embodiment of FIG. 4

This embodiment differs from that of FIGS. 2 and 3 only in having no n$^+$-type buffer region 6 and p$^+$-type collector region 7 in its semiconductor substrate $1_a$ and in having a Schottky barrier electrode $13_a$ in place of the collector electrode 13. Because of the absence of the buffer region 6 and collector region 7, the Schottky barrier electrode $13_a$ makes direct Schottky barrier contact with the second subregion 32 of the n-type base region 5. All the other details of construction are as previously set forth with reference to FIGS. 2 and 3.

The Schottky barrier electrode $13_a$ is higher in potential than the emitter electrode 12 when the device is turned on. The Schottky barrier is therefore forward biased, with the consequent injection of holes from the Schottky barrier electrode $13_a$ into the two subregions 31 and 32 of the n-type base region 5. Thus, as in the embodiment of FIGS. 2 and 3, conductivity modulation takes place, and the forward voltage lessens between the Schottky barrier electrode $13_a$, which functions as collector, and the emitter electrode 12.

Despite these changes the IGBT of FIG. 4 is akin to that of FIGS. 2 and 3 in incorporating the two subregions 31 and 32 of the n-type base region 5. All the benefits of the first disclosed embodiment are therefore also due to this modification thereof.

Figure 5:
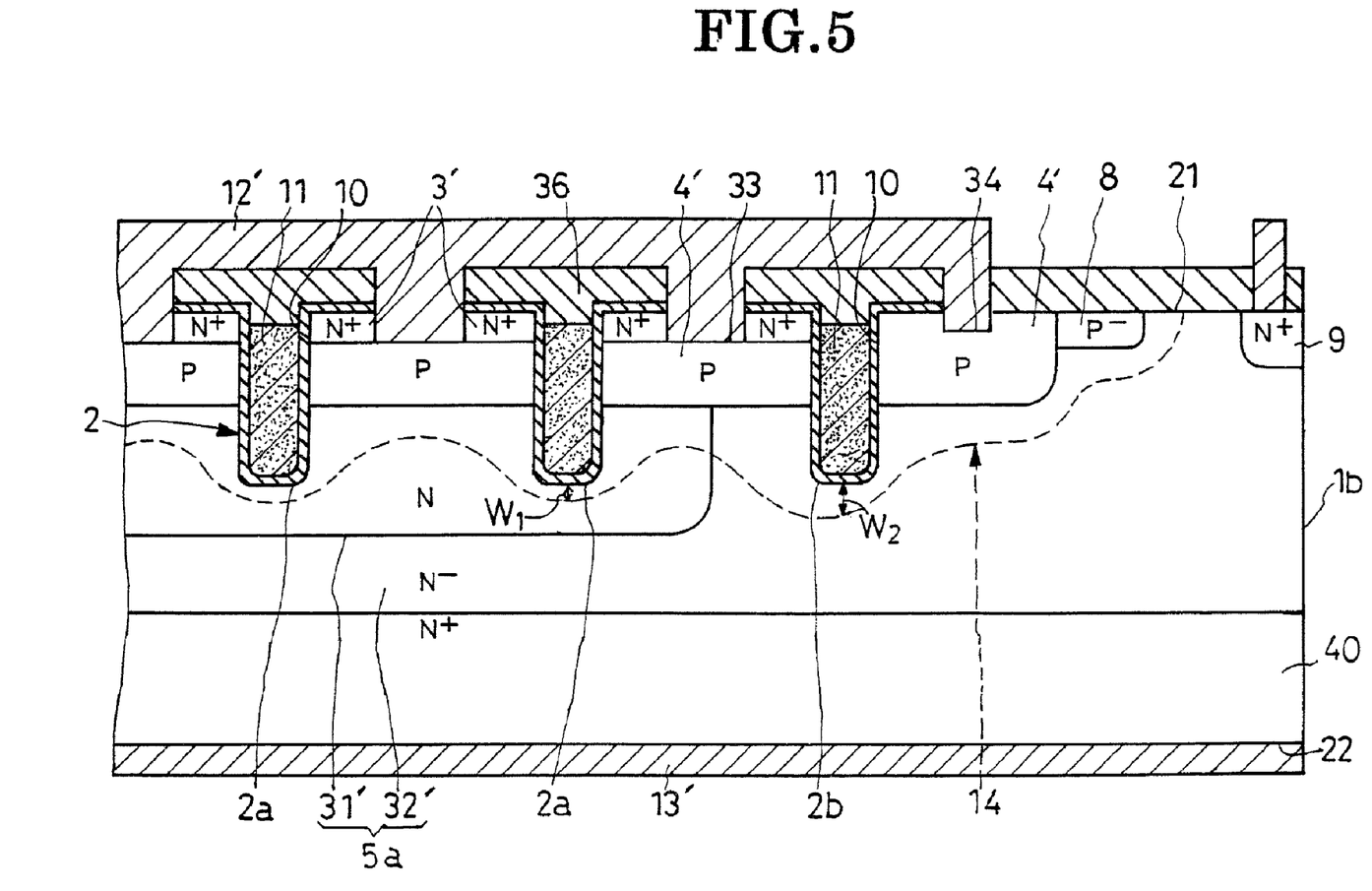
FIG. 5 is a view similar to FIG. 2 but showing an IGFET embodying the principles of this invention.

Embodiment of FIG. 5

The principles of this invention are here applied to a trenched IGFET. The semiconductor substrate $1_b$ of this IGFET differs from the substrate 1 of the first disclosed IGBT in having an n$^+$-type drain region 40 in lieu of the n$^+$-type buffer region 6 and p$^+$-type collector region 7. The n$^+$-type source regions 3', p-type base regions 4', and n-type subregion 31' and n-type subregion 32' of the drain region $5_a$ of this IGFET correspond respectively to the n$^+$-type emitter region 3, p$^+$-type base regions 4, and n-type subregion 31 and n-type subregion 32 of the base region 5 of the IGBT of FIG. 4. The source electrode 12', corresponding to the emitter electrode 12 of the FIGS. 2 and 3 embodiment, is electrically connected to both n$^+$-type source regions 3' and p-type base regions 4'. The drain electrode 13', corresponding to the collector electrode 13 of the FIGS. 2 and 3 embodiment, is electrically connected to the n$^+$-type drain region 40.

Both n-type subregion 31' and n-type subregion 32' of the drain region $5_a$ of this IGFET play a major role in determination of the indicated contour of the depletion region when the device is off, as do the two subregions 31 and 32 of the n-type base region 5 of the IGBT of FIGS. 2 and 3. There is thus obtained a trenched IGFET having an improved antivoltage strength and improved immunity to destruction.

Figure 6:
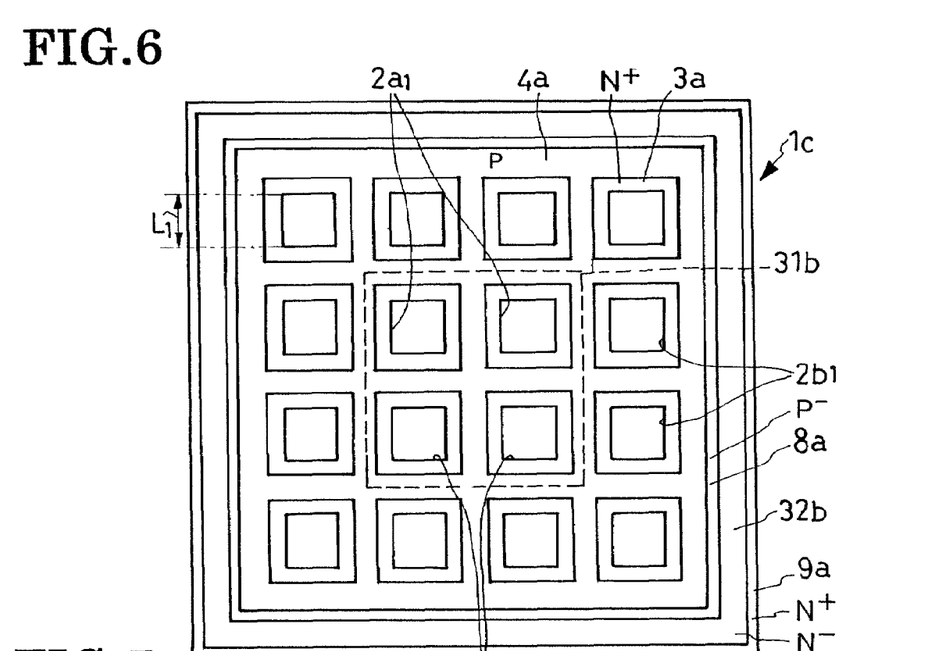
FIG. 6 is a plan view of the substrate of yet another preferred form of IGBT according to the invention.

Embodiment of FIG. 6

The present invention is applicable to an IGBT having a trench arrangement pictured in FIG. 6, instead of that depicted in FIG. 3. The semiconductor substrate $1_c$ of this IGBT is shown to have formed therein a neat array of sixteen trenches consisting of four inside trenches $2_{a1}$ and twelve outside trenches $2_{b1}$. Actually, however, greater numbers of trenches may be employed, such for example as thirty-six inside trenches and twenty-eight outside trenches. Whatever the numbers, the inside trenches may outnumber the outside trenches. Each inside trench $2_{a1}$ and each outside trench $2_{b1}$ are encircled by an n⁺-type emitter region $3_a$. Each of these trenches $2_{a1}$ and $2_{b1}$ is further encircled via the emitter regions $3_a$ by a latticed p-type base region $4_a$.

This IGBT also has the n-type base region comprising an n-type first subregion $31_b$ and n-type second subregion $32_b$. Indicated in phantom outline in FIG. 6, the first base subregion $31_b$ underlies the inside trenches $2_{a1}$. The second base subregion $32_b$ partly underlies the first base subregion $31_b$ and is partly exposed annularly at the substrate surface between p⁻-type RESURF region $8_a$ and n⁺-type channel stop region $9_a$. A vertical section through this substrate $1_c$ across the trenches $2_{a1}$ and $2_{b1}$ is substantially similar to that drawn in FIG. 2.

The inside trenches $2_{a1}$ and outside trenches $2_{b1}$ are all of the same shape and size. Thus, if $L_1$ is the length of each side of each trench as seen in a plan view as in FIG. 6, the sum of the outer sides of the twenty-eight outside trenches $2_{b1}$ is: $32 \times L_1$. The sum of all the four sides of each of the thirty-six inside trenches $2_{a1}$ is: $4 \times 36 \times L_1 = 144 \times L_1$. The sum of the four sides of each of the inside trench $2_{a1}$ is greater than the sum of the outer sides of the outside trenches $2_{b1}$.

The first base subregion $31_b$ of this FIG. 6 embodiment surrounds the inside trenches $2_{a1}$ just as the first base subregion 31 of the FIGS. 2 and 3 embodiment surrounds the inside trenches $2_a$. Breakdown is therefore easier to occur in the neighborhoods of the inside trenches $2_{a1}$ than in the prior art. Thus, in this embodiment too, as in that of FIGS. 2 and 3, any concentrated current flow is avoided at the time of breakdown.

Figure 7:
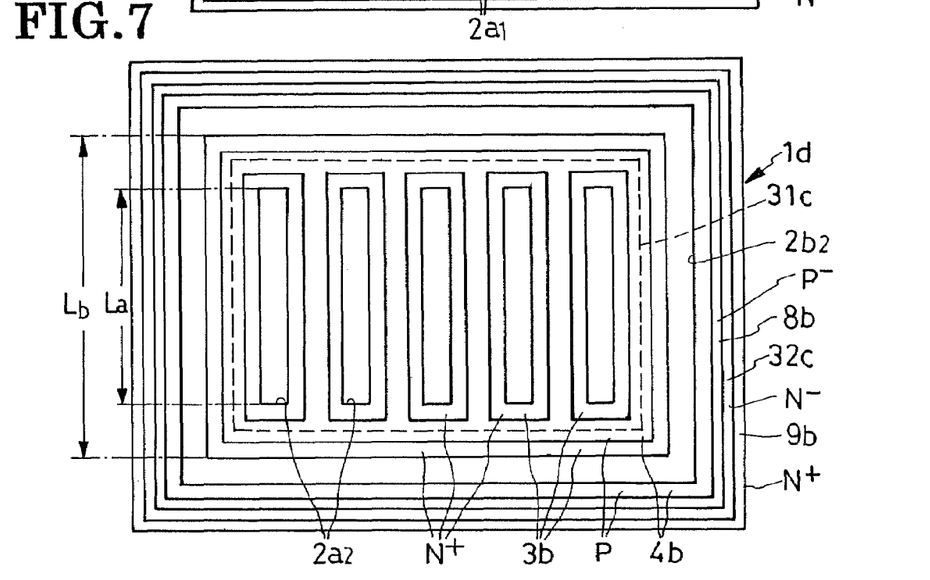
FIG. 7 is a plan view of the substrate of a further preferred form of IGBT according to the invention.

Embodiment of FIG. 7

The IGBT of FIGS. 2 and 3 may have its inside trenches $2_a$, outside trench $2_b$, emitter regions 3, p-type base regions 4, two subregions 31 and 32 of the n-type base region 5, RESURF region 8, and channel stop region 9 modified respectively into inside trenches $2_{a2}$, outside trench $2_{b2}$, emitter regions $3_b$, p-type base regions $4_b$, n-type base subregions $31_c$ and $32_c$, RESURF region $8_b$, and channel stop region $9_b$ as in the embodiment shown in FIG. 7. This modified IGBT is identical with that of FIGS. 2 and 3 in all the other details of construction.

The illustrated five representative inside trenches $2_{a2}$ in the semiconductor substrate $1_d$ of the modified IGBT extend in parallel spaced relationship to one another. The outside trench $2_{b2}$ is annular in shape, encircling all the inside trenches $2_{a2}$. The emitter regions $3_b$ include an inner annular portion encircling each inside trench $2_{a2}$ and an outer annular portion encircling all the inside trenches $2_{a2}$ on the inside of the outside trench $2_{b2}$. Alternatively, each inside trench may only be flanked with a pair of emitter regions. It is also possible to omit the outer annular emitter region around all the inside trenches $2_{a2}$.

The p-type base regions $4_b$ include a portion surrounding all the inside trenches $2_{a2}$ via the inner annular portions the emitter regions $3_b$ and exposed at the substrate surface, and another portion surrounding the outside trench $2_{b2}$ and also exposed at the substrate surface. Shown bounded by the broken lines, the n⁺-type first base subregion $31_c$ contains parts of all the inside trenches $2_{a2}$. The second subregion $32_c$ of the n-type base region, partly underlying the first base subregion $31_c$, is partly exposed annularly at the substrate surface between the annular RESURF region $8_b$ and annular channel stop region $9_b$. The cross sectional configuration of this IGBT is substantially similar to that shown in FIG. 2.

As indicated in FIG. 7, let $L_a$ be the length of each inside trench $2_{a2}$, and $L_b$ the length of each of those portions of the outside trench $2_{b2}$ which extend parallel to each inside trench $2_{a2}$. The sum, $5 \times 2 \times L_a$, of the lengths of the longitudinal edges of the five inside trenches $2_{a2}$ is longer than the sum, $2 \times L_b$, of the lengths of the outermost edges of those portions of the outside trench $2_{b2}$ which extend parallel to each inside trench $2_{a2}$. Additionally, the first subregion $31_c$ of the n-type base region are disposed contiguous to the tips of the inside trenches $2_{a2}$ as in the embodiment of FIGS. 2 and 3. Consequently, in this modified IGBT too, as in that of FIGS. 2 and 3, breakdown is easier to occur at the inside portion of the substrate 1 where the inside trenches $2_{a2}$ are formed. This embodiment wins all the noted advantages of the first disclosed embodiment.

Possible Modifications

The present invention is not to be limited by the illustrated embodiments but admits of a variety of modifications such as the following:

1. The arrangement of the inside trenches $2_{a1}$ and outside trenches $2_{b1}$ in FIG. 6 and that of the inside trenches $2_{a2}$ and outside trenches $2_{b2}$ in FIG. 7 are both applicable to FETs.

2. In the IGBTs of both FIGS. 2 and 3 and FIG. 4, an additional n⁺-type emitter region 3 could be provided on the outside of the outside trench $2_b$, and the n⁺-type emitter region 3 could be omitted from immediately inside the outside trench $2_b$.

3. In the IGFET of FIG. 5, an additional n⁺-type source region 3' could be provided on the outside of the outside trench $2_b$, and the n⁺-type source region 3' could be omitted from immediately inside the outside trench $2_b$.

4. In the IGBT of FIG. 6, the n⁺-type emitter region $3_a$ is eliminable from around the outside trench $2_{b1}$.

5. The conductivity types of the various regions of the semiconductor substrate 1, $1_a$, $1_b$ or $1_c$ are reversible.

6. A known guard ring and/or field plate may be provided on the outside of the outside trench $2_b$, $2_{b1}$ or $2_{b2}$.

7. Both p⁺-type collector region 7 of the FIGS. 2 and 3 embodiment and the n⁺-type drain region 40 of the FIG. 5 embodiment may be formed to include part exposed at the major surface 21 of the substrate 1 or $1_b$, and the collector electrode 13 and drain electrode 13' may be disposed on that substrate surface 21.

8. The p-type base region 4 may preferably be flat-bottomed but might be furnished with a projection or projections as taught by Japanese Unexamined Patent Publication No. 2005-57028 above.

9. In FIG. 2 the thickness $W_1$ of the depletion region 14 under each inside trench $2_a$ is desired to be less than, but may be equal to, the thickness $W_2$ of the depletion region 14 under the outside trench $2_b$.

What is claimed is:

1. A trenched semiconductor device characterized by comprising:
    a substrate of semiconducting material having a first and a second opposite major surface;
    there being a plurality of inside trenches formed in said substrate, each inside trench extending from said first major surface of said substrate toward said second major surface thereof;
    there being an outside trench formed in said substrate outwardly of said inside trenches and extending from said first major surface of said substrate toward said second major surface thereof;

a first semiconductor region of a first conductivity type formed in said substrate contiguous to said inside trenches and exposed at said first major surface of said substrate;

a second semiconductor region of a second conductivity type formed in said substrate and contiguously underlying said first semiconductor region, said second semiconductor region being contiguous to both of said inside trenches and said outside trench and being exposed in part at said first major surface of said substrate;

a third semiconductor region of said first conductivity type formed in said substrate contiguous to both of said second semiconductor region and said inside trenches, said third semiconductor region being buried deeper in said substrate from said first major surface thereof than said inside trenches;

a fourth semiconductor region of said first conductivity type formed in said substrate contiguous to all of said second and said third semiconductor region and said outside trench and partly exposed at said first major surface of said substrate on the outside of said outside trench, said fourth semiconductor region being less in impurity concentration than said third semiconductor region;

an insulating film in each of said inside trenches and said outside trench;

a plurality of trench conductors received one in each of said inside trenches and said outside trench via said insulating film;

a first primary electrode electrically coupled to said first semiconductor region;

a second primary electrode electrically coupled to said fourth semiconductor region; and a gate electrode electrically coupled to said trench conductors.

2. A trenched semiconductor device as defined in claim 1, characterized by further comprising a fifth semiconductor region of said second conductivity type disposed between said fourth semiconductor region and said second major surface of said substrate, said second primary electrode being electrically coupled to said fifth semiconductor region.

3. A trenched semiconductor device as defined in claim 2, characterized by further comprising a sixth semiconductor region of said first conductivity type disposed between said fourth and said fifth semiconductor region, said sixth semiconductor region being higher in impurity concentration than said fourth semiconductor region.

4. A trenched semiconductor device as defined in claim 1, characterized in that said second primary electrode is a metal-made electrode in Schottky contact with said fourth semiconductor region.

5. A trenched semiconductor device as defined in claim 1, characterized in that the sum of the edges bounding the entrance ends of said inside trenches is longer than the sum of the outmost edges of the entrance end of said outside trench.

6. A trenched semiconductor device as defined in claim 1, characterized in that the sum of the areas of the entrance ends of said inside trenches is greater than that of said outside trench.

* * * * *